United States Patent
Kuh et al.

(10) Patent No.: US 8,617,950 B2
(45) Date of Patent: Dec. 31, 2013

(54) METHOD OF FORMING A CAPACITOR AND METHOD OF MANUFACTURING A SEMICONDUCTOR DEVICE USING THE SAME

(75) Inventors: Bong Jin Kuh, Suwon-si (KR); Jong Cheol Lee, Seoul (KR); Yong Suk Tak, Seoul (KR); Young Sub You, Suwon-si (KR); Kyu Ho Cho, Hwaseong-si (KR); Jong Sung Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/438,151

(22) Filed: Apr. 3, 2012

(65) Prior Publication Data

US 2012/0264271 A1    Oct. 18, 2012

(30) Foreign Application Priority Data

Apr. 18, 2011  (KR) .......................... 10-2011-0035878

(51) Int. Cl.
*H01L 21/8242* (2006.01)

(52) U.S. Cl.
USPC .................................... 438/256; 257/E21.02

(58) Field of Classification Search
USPC ........... 438/256, 657; 257/E21.015, E21.017, 257/E21.02
See application file for complete search history.

(56) References Cited

U.S. PATENT DOCUMENTS

| 6,949,428 B2 * | 9/2005 | Seo ............................... 438/253 |
| 7,704,828 B2 | 4/2010 | Oh et al. |
| 7,709,342 B2 * | 5/2010 | Kim et al. ..................... 438/391 |

FOREIGN PATENT DOCUMENTS

| KR | 100772896 B1 | 5/2006 |
| KR | 20070060352 | 6/2007 |
| KR | 20080000843 | 5/2008 |

* cited by examiner

*Primary Examiner* — Chandra Chaudhari
(74) *Attorney, Agent, or Firm* — Volentine & Whitt, PLLC

(57) ABSTRACT

A capacitor is fabricated by forming a mold layer of a silicon based material that is not an oxide of silicon, e.g., polysilicon or doped polysilicon, on a substrate, forming an opening through the mold layer, forming a barrier layer pattern along the sides of the opening, subsequently forming a lower electrode in the opening, then removing the mold layer and the barrier layer pattern, and finally sequentially forming dielectric layer and an upper electrode on the lower electrode.

20 Claims, 14 Drawing Sheets

METHOD OF FORMING A CAPACITOR AND METHOD OF MANUFACTURING A SEMICONDUCTOR DEVICE USING THE SAME

PRIORITY STATEMENT

This application claims priority under 35 USC §119 to Korean Patent Application No. 10-2011-0035878 filed on Apr. 18, 2011 in the Korean Intellectual Property Office (KIPO), the contents of which are herein incorporated by reference in their entirety.

BACKGROUND

1. Field

The inventive concept relates to a method of fabricating a capacitor and to a method of manufacturing a semiconductor device including a capacitor.

2. Description of the Related Art

As semiconductor devices become more highly integrated, the footprint of capacitors of the devices becomes smaller and yet the capacitors still must provide a high capacitance. One way in which a capacitor having a small footprint can nonetheless provide a high capacity is for the capacitor to have a high aspect ratio (a high ratio of height to width). In this respect, a capacitor having sides that are vertical (perpendicular) with respect to a substrate, on which the capacitor is formed, is desirable because the height of a capacitor is maximal when the sides of the capacitor are vertical.

Typically, a capacitor of a semiconductor device is fabricated by forming a mold layer of an oxide on a substrate, forming an opening in the mold layer, and then forming a storage electrode along the sides of the opening. However, the process used to at least initially form the opening in the mold layer often leaves the opening without vertical sides. In particular, the higher the aspect ratio of the opening, the more difficult it is to form vertical sidewalls that define the sides of the opening.

SUMMARY

According to an aspect of the inventive concept, there is provided a method of manufacturing a capacitor in which a mold layer, comprising silicon but excluding oxides of silicon, is form on a substrate, an opening is formed through the mold layer, a barrier layer is formed along the sides of the opening, a lower electrode is formed in the opening including over the barrier layer, the mold layer and the barrier layer are then removed, and a dielectric layer and an upper electrode are sequentially formed on the lower electrode.

According to another aspect of the inventive concept, there is provided a method of manufacturing a capacitor in which a mold layer comprising doped or undoped polysilicon is formed on an upper surface of a substrate, the mold layer is etched to form an opening through the mold layer, a barrier layer is formed along the sides of the opening, a lower electrode is formed in the opening including over the barrier layer, the mold layer and the barrier layer are subsequently removed, and a dielectric layer and an upper electrode are sequentially formed on the lower electrode.

According to another aspect of the inventive concept, there is provided a method of manufacturing a capacitor in which a transistor is formed at an upper portion of a substrate, an insulating interlayer is formed on the substrate over the transistor, a contact plug is formed through the insulating interlayer, at least one mold layer comprising silicon but excluding oxides of silicon is formed on the insulating interlayer and the contact plug, an opening is formed through the at least one mold layer such that the opening exposes top surfaces of the contact plug and the insulating interlayer, a barrier layer is formed along the sides of the opening, a lower electrode is formed in the opening including over the exposed top surfaces of the contact plug and the insulating interlayer, and the barrier layer, then the mold layer and the barrier layer are removed, and a dielectric layer and an upper electrode are sequentially formed on the lower electrode.

BRIEF DESCRIPTION OF THE DRAWINGS

The inventive concept will be more clearly understood from the following detailed description of the preferred embodiments thereof taken in conjunction with the accompanying drawings.

DETAILED DESCRIPTION OF THE PREFERRED EMBODIMENTS

Figure 1:
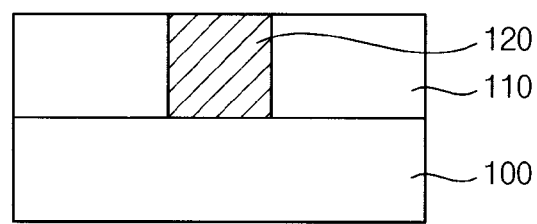
FIGS. 1 to 7 are cross-sectional views illustrating one embodiment of a method of forming a capacitor in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" another element or layer, it can be directly on the other element or layer or intervening elements or layers may be present. In contrast, when an element or layer is referred to as being "directly on" or in contact with another element or layer, there are no intervening elements or layers present.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A first embodiment of a method of forming a capacitor in accordance with the inventive concept will now be described with respect to FIGS. 1 and 7.

Referring first to FIG. 1, an insulating interlayer 110 is formed on a substrate 100.

The substrate 100 is a semiconductor substrate. For example, the substrate 100 may be a silicon (Si) substrate, a germanium (Ge) substrate, a silicon-germanium (Si—Ge) substrate, a silicon-on-insulator (SOI) substrate, or a germanium-on-insulator (GOI) substrate, etc. The substrate 100 may also be of material doped with n-type or p-type impurities.

The insulating interlayer 110 may be formed of an oxide such as silicon oxide. For example, the insulating interlayer 110 may be formed of at least one of boro-phosphor silicate glass (BPSG), undoped silicate glass (USG), and spin on glass (SOG). Accordingly, the insulating interlayer 110 may be formed by a chemical vapor deposition (CVD) process or a physical vapor deposition (PVD) process.

Additionally, a plug 120 is formed through the insulating interlayer 110. For example, the insulating interlayer 110 is etched to form a hole (not shown) exposing a top surface of the substrate 100, and a conductive layer is formed on the substrate 100 and the insulating interlayer 110 to such a thickness as to fill the hole. In this respect, the conductive layer may be formed of doped polysilicon or a metal by a CVD process, a PVD process, an atomic layer deposition (ALD) process or the like. Then the conductive layer may be planarized by a chemical mechanical polishing (CMP) process and/or an etch-back process until the upper surface of the insulating interlayer 110 is exposed and the plug 120 is left filling the hole.

Figure 2:
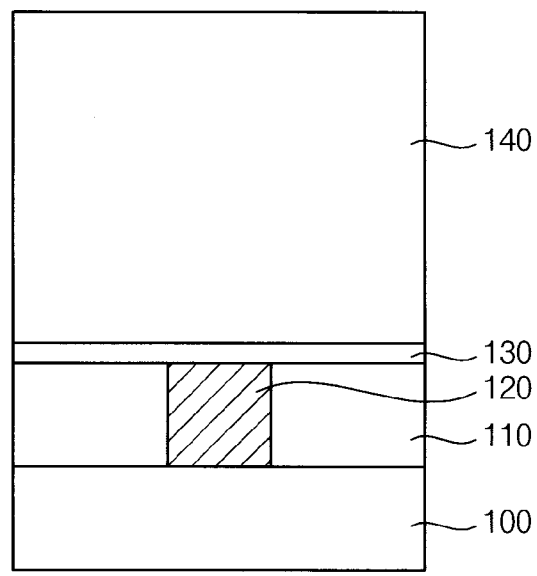

Referring to FIG. 2, an etch stop layer 130 and a mold layer 140 are sequentially formed on the insulating interlayer 110 and the plug 120.

The etch stop layer 130 may be formed of silicon nitride by a CVD process, a PVD process, an ALD process, or the like.

The mold layer 140 is formed of a silicon non-oxide material, e.g., amorphous silicon, amorphous silicon doped with impurities, polysilicon, or polysilicon doped with impurities. Thus, the mold layer 140 may be formed by a CVD process, a PVD process, or the like. The impurities that may be employed include carbon (C), boron (B), phosphorous (P), nitrogen (N), aluminum (Al), titanium (Ti), oxygen (O), and arsenic (As). In an example of this embodiment, the mold layer 140 has a thickness equal to or more than 1 μm.

Figure 3:
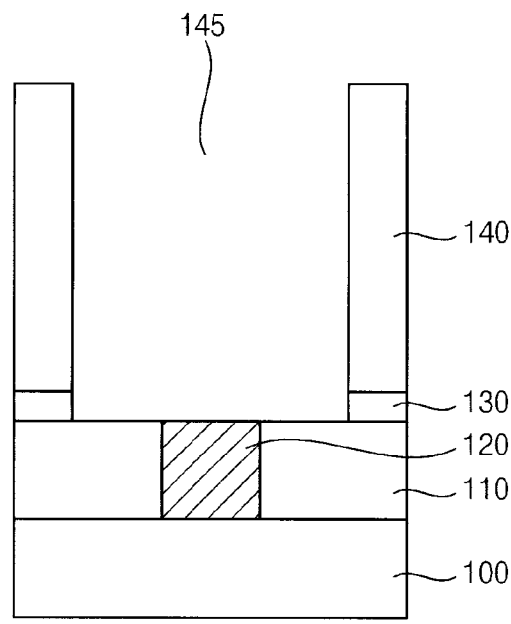

Referring to FIG. 3, parts of the mold layer 140 and the etch stop layer 130 are removed to form an opening 145 exposing a top surface of the plug 120. At this time, part of the top surface of the insulating interlayer 110 may be exposed by the opening 145.

Specifically, a portion of the mold layer 140 may be dry etched to form the opening 145, using a photoresist pattern (not illustrated) as an etching mask, until the etch stop layer 130 is exposed. As examples of such a dry etching process, the mold layer 140 is etched by an etching gas comprising hydrogen fluoride (HF), hydrogen bromide (HBr), tetrafluoromethane ($CF_4$), hexafluoroethane ($C_2F_6$), trifluoromethane ($CHF_3$), difluoromethane ($CH_2F_2$), methyl bromide ($CH_3Br$), chlorotrifluoromethane ($CClF_3$), trifluorobromomethane ($CBrF_3$), carbon tetrachloride ($CCl_4$), sulfur hexafluorid ($SF_6$), chlorine ($Cl_2$), or nitrogen trifluorude ($NF_3$). Alternatively, the mold layer 140 may be wet etched, to form the opening 145, by a solution of hydrogen fluoride (HF), ammonium hydroxide ($NH_4OH$), potassium hydroxide (KOH), or sodium hydroxide (NaOH), for example, or a buffered oxide etch (BOE) solution.

The etch stop layer 130 is provided as a means to terminate this part of the etching process for forming the opening 145. However, the exposed portion of the etch stop layer may be removed to complete the opening 145. To this end, the etch stop layer 130 may be etched by an etching gas comprising monofluoromethane ($CH_3F$), trifluoromethane ($CHF_3$), tetrafluoromethane ($CF_4$), hexafluoroethane ($C_2F_6$), or nitrogen trifluoride ($NF_3$).

In any case, the opening 145 has substantially vertical sides, i.e., the sidewall of the mold layer 140 that defines the sides of the opening 145 is substantially perpendicular to the top surface of the substrate 100, because the mold layer 140 is not formed of an oxide.

Figure 4:
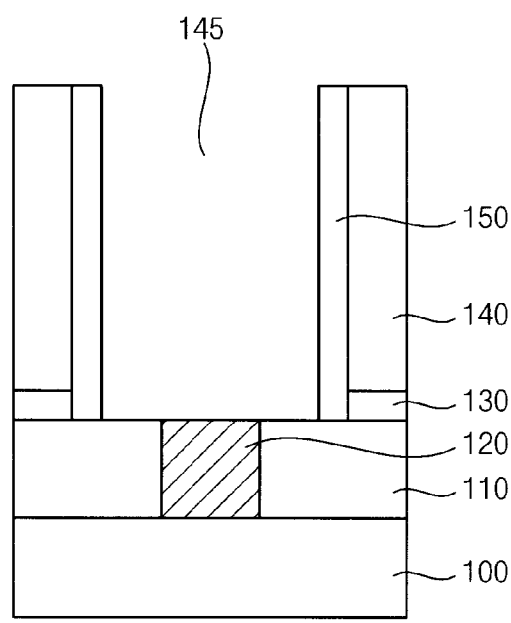

Referring to FIG. 4, a barrier layer is formed (not shown) on the substrate 100 to cover the top surfaces of the plug 120 and the insulating interlayer 110 exposed by the opening 145 and the sides of the opening 145. Then the barrier layer is anisotropically etched to form a barrier layer pattern 160 on the sides of the opening 145.

Figure 5:
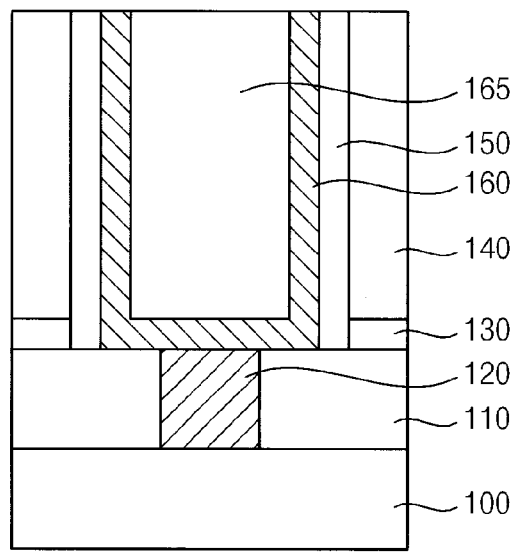

The barrier layer may be formed of at least one material selected from the group consisting of silicon oxide, titanium oxide, aluminum oxide, tantalum oxide, silicon nitride, silicon oxynitride, silicon carbonitride, germanium oxide, germanium nitride, germanium oxynitride and germanium carbonitride. In this embodiment, the barrier layer pattern 150 is formed to a thickness of several angstroms or tens of angstroms. To these ends, the barrier layer may be formed by a CVD process, an ALD process, a molecular beam epitaxy (MBE) process, or the like Referring to FIG. 5, a lower electrode 160 is formed on in the opening 145, i.e., over the exposed top surfaces of the plug 120 and the insulating interlayer 110 and a sidewall of the barrier layer pattern 150. Accordingly, the lower electrode is cup-shaped or cylindrical. The lower electrode 160 may be formed of a metal or a metal nitride on the substrate 100. For example, a lower electrode layer may be formed of titanium (Ti), tantalum (Ta), aluminum (Al), ruthenium (Ru), tungsten (W), copper (Cu), titanium nitride, tantalum nitride, or tungsten nitride on the substrate. The lower electrode layer may be a conformal layer formed on the substrate 100 so as to not only cover the barrier layer pattern 160, etc, but so as to cover the upper surface of the mold layer 140, as well.

Additionally, a sacrificial layer pattern 165 may then be formed to fill the remaining portion of the opening 145. In particular, the sacrificial layer pattern 165 may be formed of an oxide. Even more specifically, the oxide may be propylene oxide (PDX), phenyltriethoxysilane (PTEOS), boro-phosphoro silicate glass (BPSG), or phosphor silicate glass (PSG), for instance. Furthermore, the oxide as a sacrificial layer may be formed to such a thickness as to fill the remaining portion of the opening 145 and cover the lower electrode layer on the mold layer 140.

Then a chemical mechanical polishing (CMP) process and/or an etch-back process may be performed to remove upper portions of the lower electrode layer and the sacrificial layer until a top surface of the mold layer 140 is exposed.

Alternatively, the lower electrode 160 is formed to fill the opening 145 (i.e., the sacrificial layer pattern 165 is not formed). In this case, the lower electrode 160 has the form of a pillar.

Figure 6:
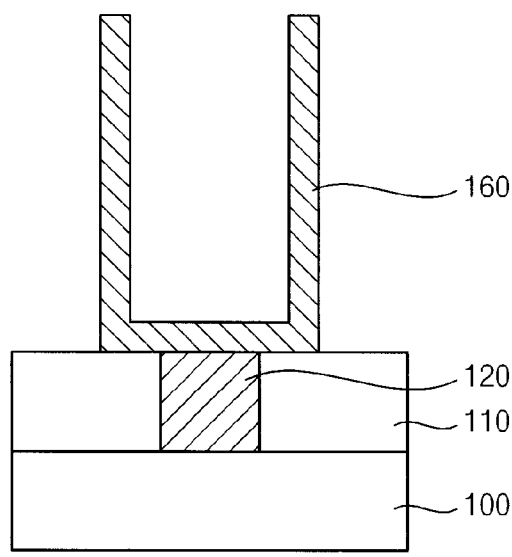

Referring to FIG. 6, the mold layer 140, the sacrificial layer pattern 165 and the barrier layer pattern 150 are removed. In this process, the etch stop layer 130 may be removed together with the mold layer 140, the sacrificial layer pattern 165 and the barrier layer pattern 150. For example, the mold layer 140, the sacrificial layer pattern 165 and the barrier layer pattern 150 are removed by a wet etching process.

Figure 7:
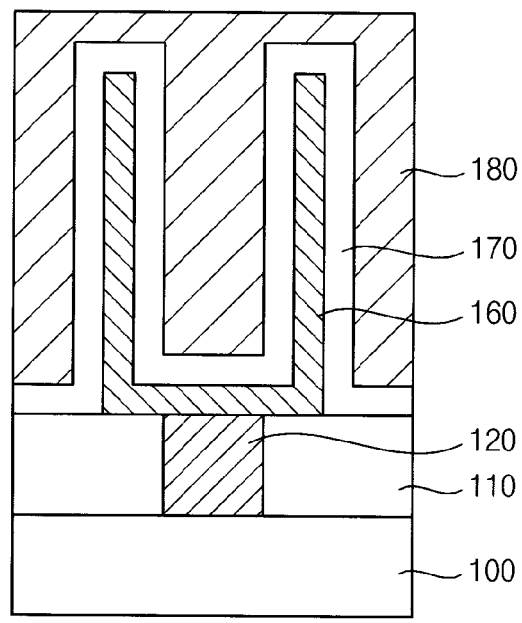

Referring to FIG. 7, a dielectric layer 170 is formed on the insulating interlayer 110 to cover the lower electrode 160, and an upper electrode 180 is formed on the dielectric layer 170.

The dielectric layer 170 may be formed of silicon oxide, silicon nitride or a metal oxide having a high dielectric constant. Examples of the metal oxide that may be used include tantalum oxide, hafnium oxide, aluminum oxide, and zirconium oxide. These materials may be used alone or in combination. Furthermore, the dielectric layer 170 may be formed by a CVD process, a PVD process, an ALD process, or the like.

The upper electrode 180 may also be formed by a CVD process, a PVD process, an ALD process, or the like. Furthermore, the upper electrode 180 may be a blanket layer, like that shown in FIG. 7, or a relatively thin conformal layer having a uniform thickness.

In the above-described embodiment of a method of forming a capacitor in accordance with the inventive concept, the lower electrode 160 is formed on a barrier layer pattern so that the mold layer 140 and the lower electrode 160 do not contact each other. As a result, a metal silicide layer is not formed. Accordingly, the dielectric layer 170 may have a uniform thickness, unlike a dielectric layer formed on a metal silicide layer. Hence, a capacitor formed according to any of the methods described above may have all of those desirable characteristics provided by a uniformly thick upper electrode. Additionally, the dielectric layer 170 is readily formed because the opening 145 is not constricted by a metal silicide layer. Still further, the lower electrode 160 may have a vertical sidewall even at a high aspect ratio because the opening 145, in which the lower electrode 160 is formed, is itself formed in a mold layer that is not an oxide.

Another embodiment of a method of forming a capacitor in accordance with the inventive concept will now be described with reference to FIGS. 8 to 13. The method is similar to that shown in and described with reference to FIGS. 1 to 7 except for the forming of the barrier layer. Therefore, mainly only the differences between the embodiments will be described in detail hereinafter.

Figure 8:
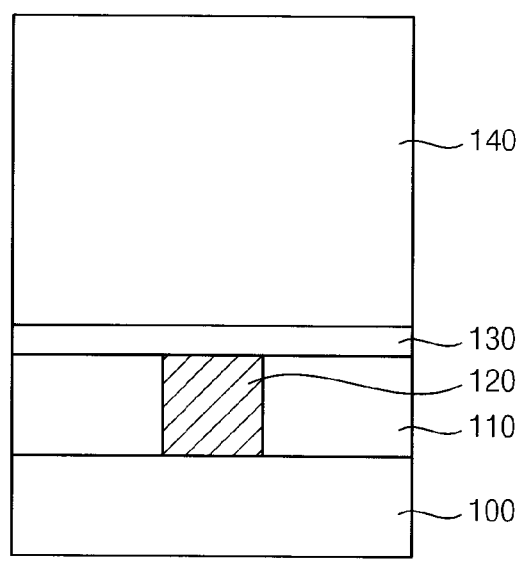
FIGS. 8 to 13 are cross-sectional views illustrating another embodiment of a method of forming a capacitor in accordance with the inventive concept.

Referring to FIG. 8, an insulating interlayer 110 is formed on a substrate 100, and a plug 120 is formed through the insulating interlayer 110. Then, an etch stop layer 130 and a mold layer 140 are sequentially formed on the insulating interlayer 110 and the plug 120.

Figure 9:
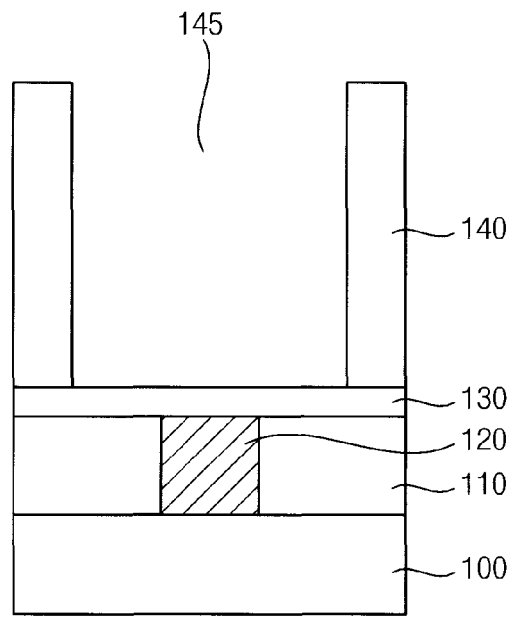

Referring to FIG. 9, part of the mold layer 140 is removed to form an opening 145.

Figure 10:
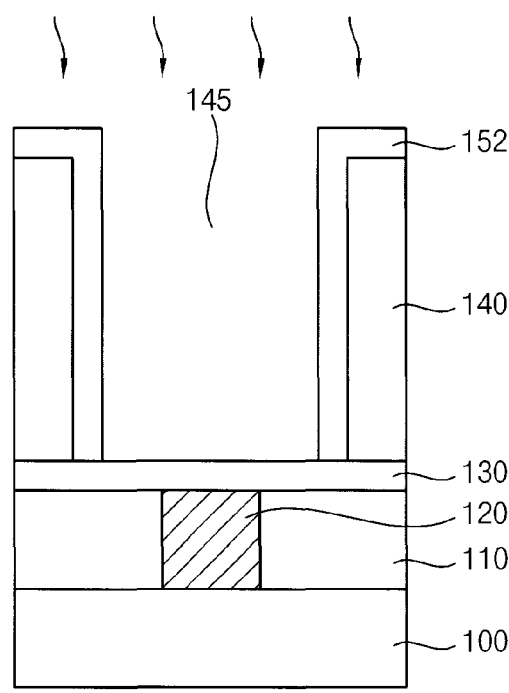

Referring to FIG. 10, the mold layer 140 having the opening 145 therethrough is oxidized to form a barrier layer 152 on exposed surfaces of the mold layer 140 including a sidewall surface defining the sides of the opening 145. As a result, the barrier layer 152 is of silicon oxide.

The oxidation process may be a radical oxidation process, an ozone-flushing process, a thermal oxidation process, or a dry oxidation process. For example, a radical oxidation process may be performed on the mold layer 140 to form silicon oxide having a uniform thickness on the sidewall and a top surface of the mold layer 140. Such a radical oxidation process may be performed using a source gas including nitrogen or oxygen under a pressure of about 0.1 to about 1 torr. In this way, the barrier layer 152 of silicon oxide may be formed to a thickness of several angstroms or tens of angstroms, for example.

Figure 11:
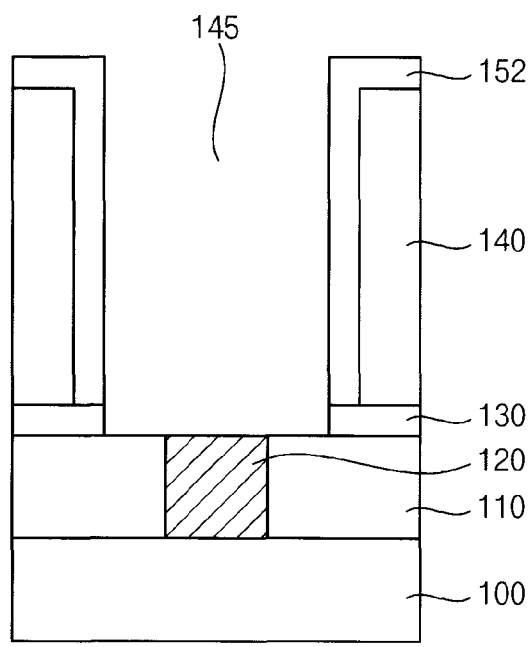

Referring to FIG. 11, the portion of the etch stop layer 130 exposed by the opening 145 is then removed to expose a top surface of the plug 120. In this case, i.e., in the case of removing the exposed portion of the etch stop layer 130 after the oxidation process, an oxidation layer is not formed on the plug 120.

In addition, the portion of the barrier layer 152 formed on the top surface of the mold layer 140 may be removed by an etching process. In this case, a barrier layer remaining on the sides of the opening 145 as a barrier layer pattern (not illustrated).

Figure 12:
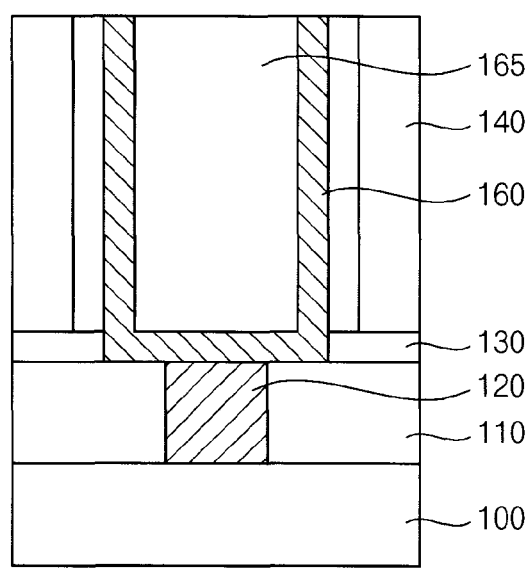

Referring to FIG. 12, a lower electrode 160 is then formed on the bottom of the opening 145 and sidewall of the barrier layer 152, and a sacrificial layer pattern 165 may be formed on the lower electrode 160 to fill what remains of the opening 145 (or the lower electrode 160 may be formed to fill the opening 145 completely).

Figure 13:
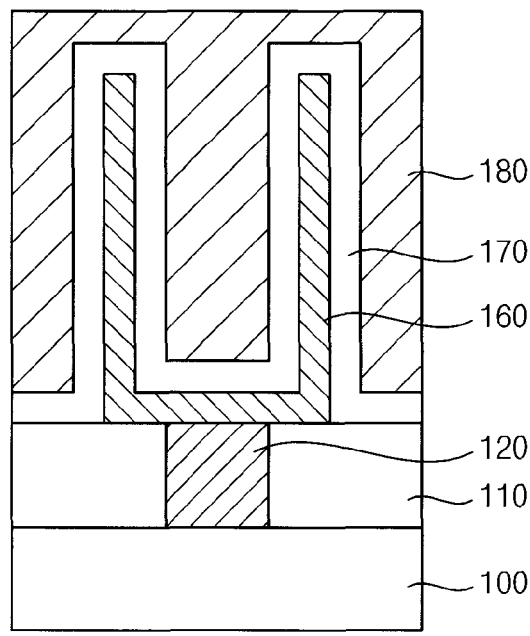

Referring to FIG. 13, the mold layer 140, the sacrificial layer pattern 165 and the barrier layer 152 are removed. Then a dielectric layer 170 and an upper electrode 180 are sequentially formed on the insulating interlayer 110 to cover the lower electrode 160.

Another embodiment of a method of forming a capacitor in accordance with the inventive concept will be described with reference to FIGS. 14 to 19. This embodiment is also similar to that shown in and described with reference to FIGS. 1 to 7 except for the forming of the barrier layer. Thus, mainly only the differences between these embodiments will be described in detail hereinafter.

Figure 14:
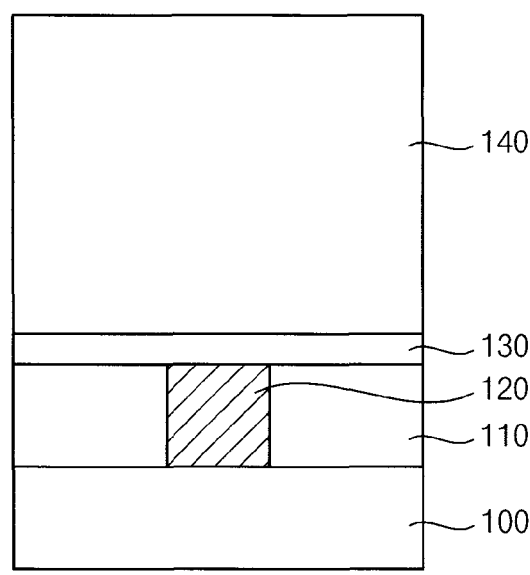
FIGS. 14 to 19 are cross-sectional views illustrating yet another embodiment of a method of forming a capacitor in accordance with the inventive concept.

Referring to FIG. 14, an insulating interlayer 110 is formed on a substrate 100, and a plug 120 is formed through the insulating interlayer 110. Then an etch stop layer 130 and a mold layer 140 are sequentially formed on the insulating interlayer 110 and the plug 120.

Figure 15:
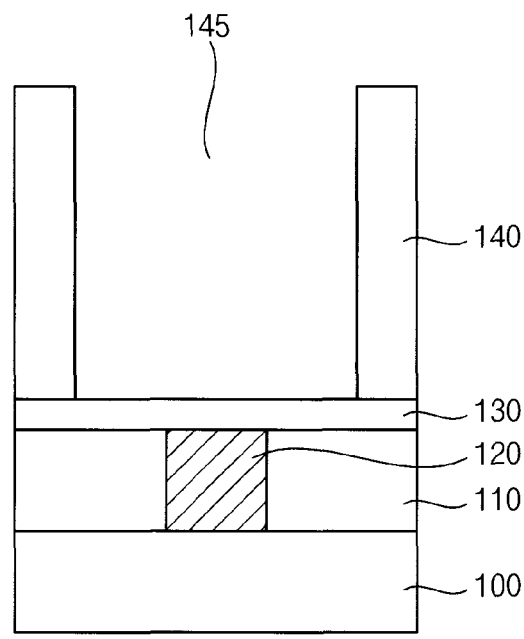

Referring to FIG. 15, part of the mold layer 140 is removed to form an opening 145.

Figure 16:
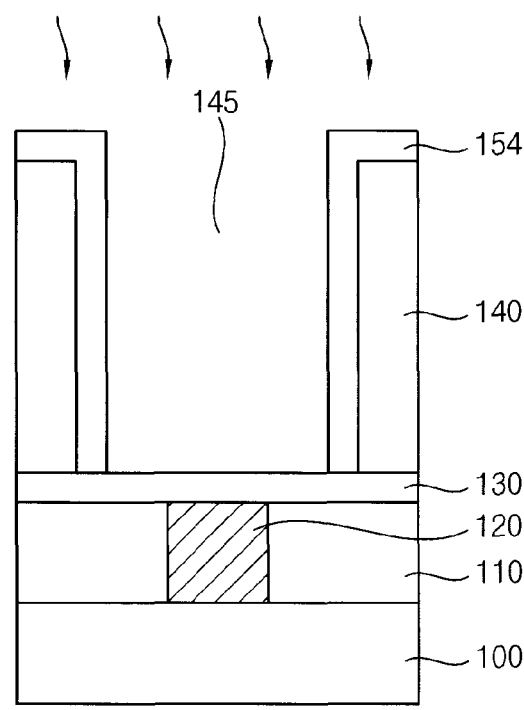

Referring to FIG. 16, the mold layer 140 having the opening 145 therethrough is then nitrided to form a barrier layer 154 on the sidewall of the mold layer 140 that defines the sides of the opening 145 and the top surface of the mold layer 140. In this case, the barrier layer 154 comprises silicon nitride.

The nitridation process may be a plasma nitridation process using ammonia ($NH_3$) or nitrogen ($N_2$) as source gas, or a thermal nitridation process. As an example, the mold layer 140 may be formed of polysilicon and subjected to a plasma nitridation process using ammonia as source gas to form a layer of silicon nitride having a uniform thickness on the sidewall and top surface of the mold layer 140. The source gas may be provided under a pressure of about 0.1 to about 1 torr. The resulting barrier layer 154 of silicon nitride may be formed to a thickness of several angstroms or tens of angstroms in this process.

Figure 17:
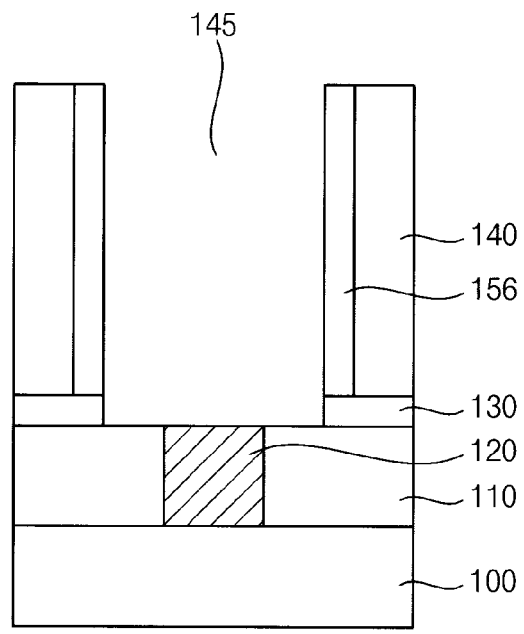

Referring to FIG. 17, the exposed portion of the etch stop layer 130 may then be removed to expose the top surface of the plug 120. In this way, a nitride layer is not formed on the plug 120. Also, that portion of the barrier layer 154 which extends along the top surface of the mold layer 140 may be removed together with the exposed portion of the etch stop layer 130. In this case, a barrier layer pattern 156 is formed on the sidewall of the opening 145.

Figure 18:
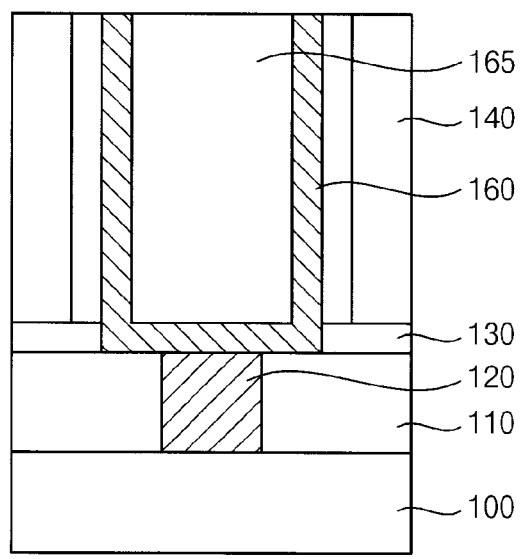

Referring to FIG. 18, a lower electrode 160 is then formed in the opening 145. Furthermore, in the case in which the lower electrode 160 is formed as a conformal layer of conductive material, a sacrificial layer pattern 165 is formed on the lower electrode 160 to fill what remains of the opening 145.

Figure 19:
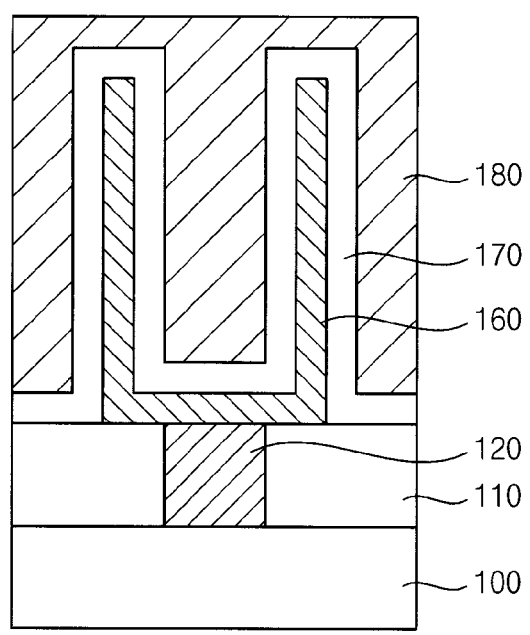

Referring to FIG. 19, the mold layer 140, the sacrificial layer pattern 165 and the barrier layer pattern 156 are then removed. Again, with respect to this part of the method, the etch stop layer 130 may be removed together with the mold layer 140, the sacrificial layer pattern 165 and the barrier layer pattern 156.

Next, a dielectric layer 170 and an upper electrode 180 are sequentially formed on the insulating interlayer 110 to cover the lower electrode 160.

A method of manufacturing a semiconductor device in accordance with the inventive concept will now be described in detail with reference to FIGS. 20 to 24.

Figure 20:
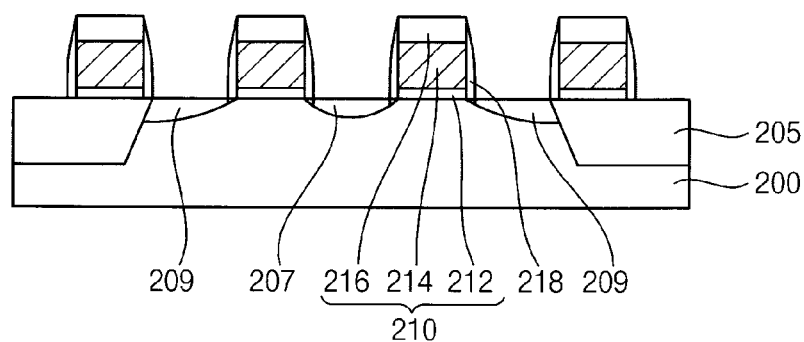
FIGS. 20 to 24 are cross-sectional views illustrating a method of manufacturing a semiconductor device in accordance with the inventive concept.

Referring to FIG. 20, an isolation layer 205 is formed at the upper portion of a substrate 200. In this example, the isolation layer 205 is formed by a shallow trench isolation (STI) process.

Next, a gate insulation layer, a gate electrode layer and a gate mask layer are sequentially formed on the substrate 200. The gate insulation layer may be formed of silicon oxide or a metal oxide. The gate electrode layer may be formed of metal or doped polysilicon. The gate mask layer may be formed of silicon nitride. In any case, the gate insulation layer, the gate electrode layer and the gate mask layer are then patterned by a photolithography process to form a plurality of gate structures 210 each of which includes a gate insulation layer pattern 212, a gate electrode 214 and a hard mask 216 sequentially stacked on the substrate 200.

Impurities are then implanted into the substrate 200 using the gate structures 210 as an ion-implantation mask to form first and second impurity regions 207 and 209 at upper portions of the substrate 200 adjacent to the gate structures 210. The first and second impurity regions 207 and 209 serve as source/drain regions of the transistors.

Furthermore, spacers 218 of silicon nitride, for example, may be formed on sidewalls of gate structures 210.

Figure 21:
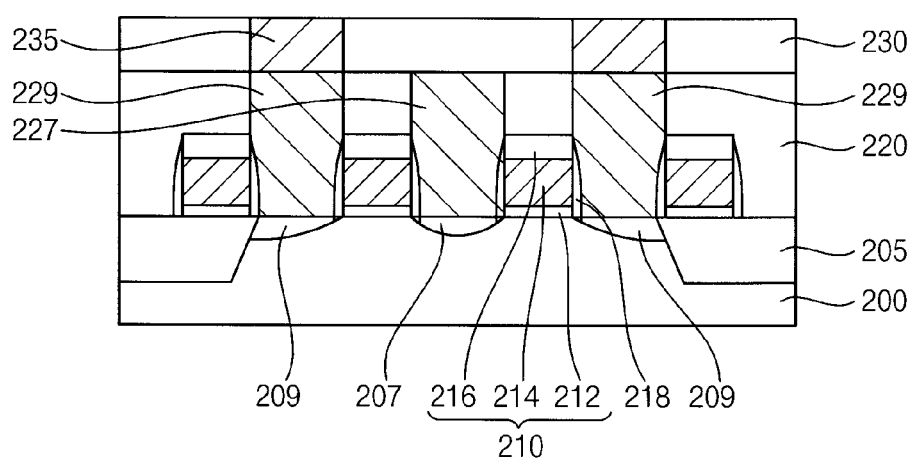

Referring to FIG. 21, a first insulating interlayer 220 is then formed on the substrate 200 to cover the gate structures 210 and the spacers 218. Part of the first insulating interlayer 220 is then removed to form first holes (not shown) exposing the impurity regions 207 and 209. In this example, the first holes are self-aligned with the impurity regions 207 and 209 by the gate structures 210 and the spacers 218.

A first conductive layer is formed on the exposed impurity regions 207 and 209 and the first insulating interlayer 220 to such a thickness as to fill the first holes. The first conductive layer may be formed of metal or doped polysilicon. The first conductive layer may then be planarized, until a top surface of the first insulating interlayer 220 is exposed, to form first and second plugs 227 and 229 electrically connected to the first and second impurity regions 207 and 209, respectively. In this example, the first plug 227 serves as a bit line contact.

A second conductive layer (not shown) is formed on the first insulating interlayer 220 to contact the first plug 227. The second conductive layer may be formed of metal or doped polysilicon. The second conductive layer is then patterned to form a bit line (not shown). Next, a second insulating interlayer 230 is formed on the first insulating interlayer 220 to cover the bit line. The second insulating interlayer 230 is then etched to form a second hole (not shown) exposing the second plug 229. A third conductive layer is then formed on the second plug 229 and the second insulating interlayer 230 to such a thickness as to fill the second hole. The third conductive layer may be formed of metal or doped polysilicon. Furthermore, the third conductive layer is planarized by a CMP process and/or an etch-back process, until a top surface of the second insulating interlayer 230 is exposed, to form a third plug 235 filling the second hole. The second and third plugs 229 and 235 collectively serve as a capacitor contact.

In another example of this embodiment, the second plug 229 is not formed in the first insulating interlayer 220. Rather, an opening is formed through the first and second insulating interlayers 220 and 230 to expose the second impurity region 209, and the third plug 235 is formed in such an opening in contact with the second impurity region 209. That is, in this example, the plug 235 serves as a capacitor contact alone.

Figure 22:
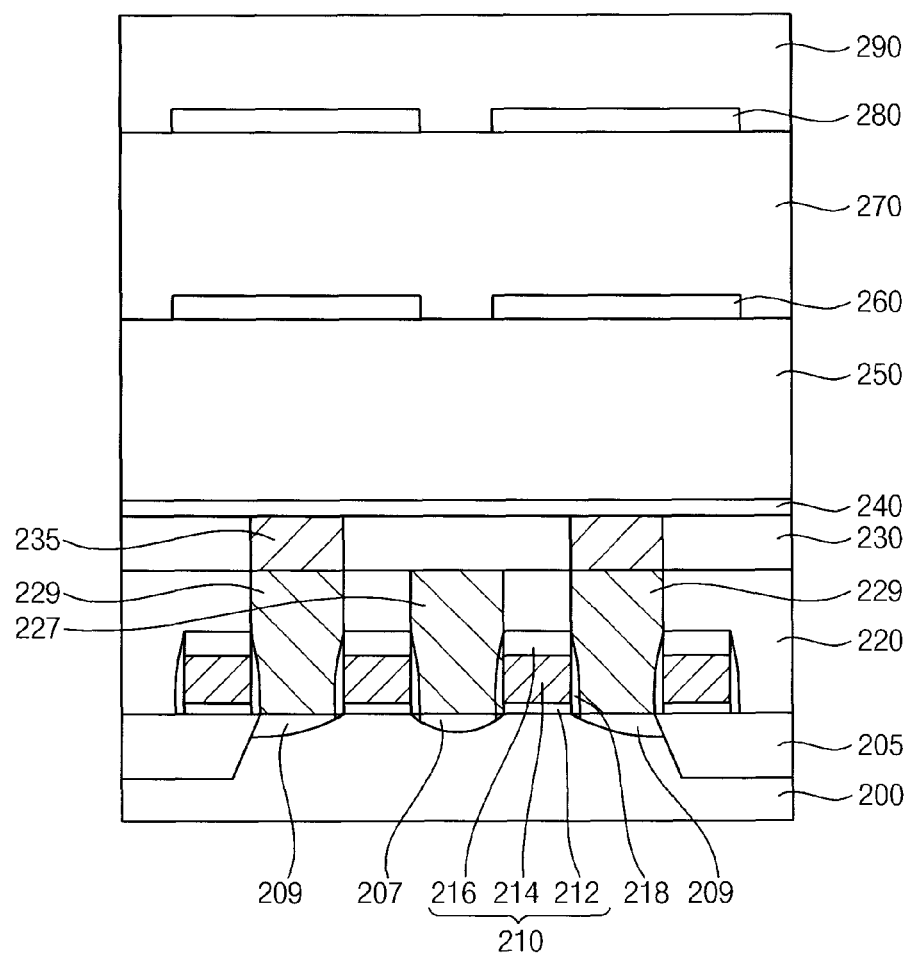

Referring to FIG. 22, an etch stop layer 240 and mold layers 250, 270 and 290 are sequentially formed on the second insulating interlayer 230 and the third plug 235. The mold layers 250, 270 and 290 may be formed of polysilicon or silicon doped with impurities. In the latter case, the impurities may be carbon (C), boron (B), phosphorous (P), nitrogen (N), aluminum (Al), titanium (Ti), oxygen (O), or arsenic (As).

Furthermore, supporting layer patterns 260 and 280 also are formed on the mold layers 250 and 270, respectively, so as to extend between adjacent ones of the mold layers 250, 270 and 290. More specifically, a first supporting layer is formed on the first mold layer 250, and the first supporting layer is patterned to form the first supporting layer pattern 260. Likewise, a second supporting layer is formed on the second mold layer 270, and the second supporting layer is patterned to form the second supporting layer pattern 280. The supporting layer patterns 260 and 280 are formed of material having an etching selectivity with respect to the mold layers 250, 270 and 290, e.g., silicon oxide, silicon nitride, or silicon oxynitride.

As will become clearer from the description below, the supporting layer patterns 260 and 280 connect certain numbers of the capacitors to prevent the capacitors from leaning or collapsing once the mold layers are removed. In this example, three mold layers and consequently, two supporting layer patterns are formed; however, the method is not so limited as the number of supporting layer patterns (and thus, mold layers on which they are respectively formed) depends on the aspect ratio of the capacitors to be formed.

Figure 23:
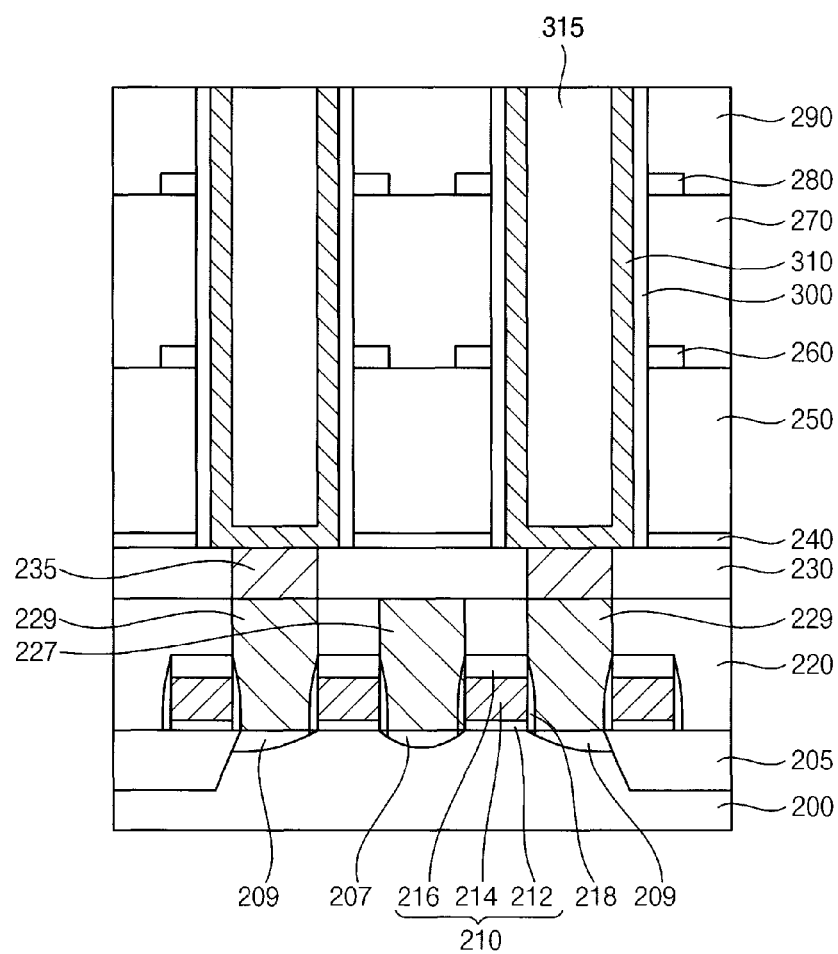

Referring to FIG. 23, portions of each of the first to third mold layers 250, 270 and 290, the first and second supporting layer patterns 260 and 280 and the etch stop layer 240 are removed to form an opening (not illustrated) exposing a top surface of the third plug 235. Furthermore, a barrier layer is formed in the opening and in particular, along the exposed top surface of the third plug 235 and the sidewall that defines the sides of the opening. The barrier layer is then anisotropically etched to form a barrier layer pattern 300 along the sides of the opening. In this respect, the barrier layer may be formed by any of the embodiments of FIGS. 1-19 described above. In addition, the supporting layer patterns 260 and 280 are formed of material having an etching selectivity with respect to the barrier layer.

For example, the barrier layer may be formed of silicon oxide, silicon nitride, aluminum oxide, tantalum oxide, etc. by a CVD process, an ALD process, or a molecular beam epitaxy (MBE) process.

Alternatively, the barrier layer may be formed of silicon oxide by an oxidation process, i.e., by oxidizing the mold layers 250, 270 and 290. Instead, the barrier layer may be formed of silicon nitride by nitriding the mold layers 250, 270 and 290. In either of these cases, as has been described above, the etch stop layer 240 is removed to expose the top surface of the third plug 235 after the barrier layer is formed. Accordingly, the silicon oxide or silicon nitride is not formed on the third plug 235.

Referring still to FIG. 23, a cup-shaped or cylindrical lower electrode 310 is formed in the opening, i.e., on the exposed top surface of the third plug 235 and the sidewall of the barrier layer pattern 300. Then, a sacrificial layer pattern 315 is formed to fill what remains of the opening.

More specifically, a lower electrode layer is formed conformally on the structure comprising the third plug 235, the insulating interlayer 230, the mold layers 250, 270 and 290 and the supporting layer patterns 260 and 280. A blanket sacrificial layer is then formed on the lower electrode layer to such a thickness as to fill the remaining portion of the opening. The lower electrode layer and the sacrificial layer are then planarized by a chemical mechanical polishing (CMP) process and/or an etch-back process, until a top surface of the third mold layer 290 is exposed, to form the lower electrode 310 and the sacrificial layer pattern 315.

Alternatively, the lower electrode 310 may be formed to fill the opening completely. In this case, the lower electrode 310 has the form of a pillar.

Figure 24:
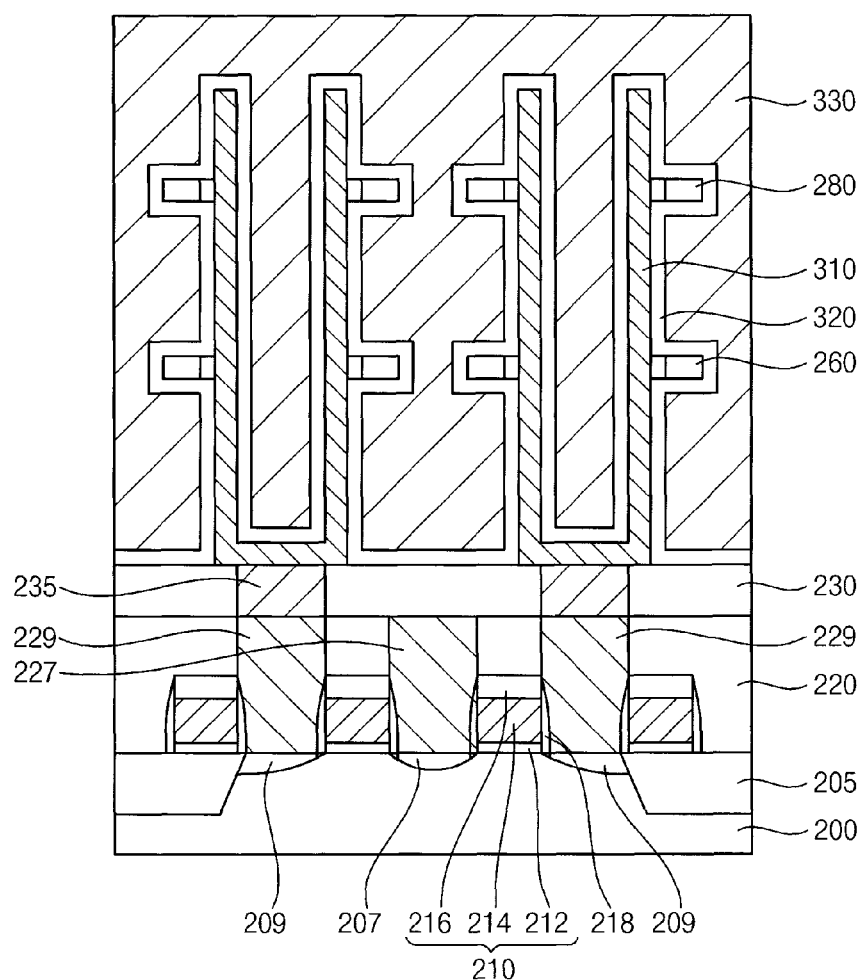

Referring to FIG. 24, the mold layers 250, 270 and 290, the sacrificial layer pattern 315 and the barrier layer pattern 300 are removed. At this time, the etch stop layer 240 may be removed together with the mold layers 250, 270 and 290, the sacrificial layer pattern 315 and the barrier layer pattern 300.

Next, a conformal dielectric layer 320 is formed on the second insulating interlayer 230 to cover the lower electrode 310, and a blanket upper electrode 330 is formed on the dielectric layer 320. Alternatively, a conformal upper electrode, i.e., a relatively thin upper electrode having a uniform thickness, is formed on the dielectric layer 320.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a capacitor, comprising:
   forming a mold layer, comprising silicon but excluding oxides of silicon, on a substrate;
   forming an opening extending through the mold layer, wherein the opening has a bottom and sides;
   forming a barrier layer along the sides of the opening;
   forming a lower electrode in the opening including over the barrier layer, wherein the barrier layer prevents a reaction from occurring between the lower electrode and the mold layer;
   removing the mold layer and the barrier layer; and
   sequentially forming a dielectric layer and an upper electrode on the lower electrode.

2. The method of claim 1, further comprising:
   forming an insulating interlayer on the substrate before the mold layer is formed; and
   forming a contact plug through the insulating interlayer, and
   wherein the forming of the opening through the mold layer comprises forming the opening to expose a top surface of the contact plug.

3. The method of claim 1, wherein the forming of the barrier layer comprises:
   forming barrier material along the bottom and sides of the opening and along a top surface of the mold layer; and
   anisotropically etching the barrier material to remove the barrier material from the bottom of the opening and the top surface of the mold layer.

4. The method of claim 1, wherein the forming of the barrier layer comprises forming barrier material on the substrate by a chemical vapor deposition process, an atomic layer deposition process or a molecular beam epitaxy process.

5. The method of claim 4, wherein the barrier material is at least one material selected from the group consisting of silicon oxide, titanium oxide, aluminum oxide, tantalum oxide, silicon nitride, silicon oxynitride, silicon carbonitride, germanium oxide, germanium nitride, germanium oxynitride and germanium carbonitride.

6. The method of claim 4, wherein the barrier layer is formed to a thickness of several angstroms or tens of angstroms.

7. The method of claim 1, wherein the forming the barrier layer comprises oxidizing a sidewall of the mold layer exposed by the opening.

8. The method of claim 7, wherein the oxidizing is executed by subjecting the mold layer to a radical oxidation process, an ozone flushing process or a thermal oxidation process.

9. The method of claim 1, wherein forming of the barrier layer comprises nitriding a sidewall of the mold layer exposed by the opening.

10. The method of claim 9, wherein the nitriding comprises subjecting the mold layer to an ammonia plasma nitridation process, a nitrogen plasma nitridation process or a thermal nitridation process.

11. The method of claim 1, wherein the forming of the mold layer comprises forming a layer selected from the group consisting of doped or undoped polysilicon, on the substrate.

12. A method of manufacturing a semiconductor device, comprising:
   forming a transistor at an upper portion of a substrate, the transistor having a gate structure and an impurity region;
   forming an insulating interlayer on the substrate and which covers the transistor;
   forming a contact plug extending through the insulating interlayer;
   forming at least one mold layer, comprising silicon but excluding oxides of silicon, on the insulating interlayer and the contact plug;
   forming an opening through the at least one mold layer that exposes top surfaces of the contact plug and the insulating interlayer, wherein the opening has a bottom and sides;
   forming a barrier layer on the sides of the opening;
   forming a lower electrode in the opening including over the exposed top surfaces of the contact plug and the insulating interlayer, and the barrier layer, wherein the barrier layer prevents a reaction from occurring between the lower electrode and the mold layer;
   removing the mold layer and the barrier layer; and
   sequentially forming a dielectric layer and an upper electrode on the lower electrode.

13. The method of claim 12, wherein the forming of the barrier layer comprises:
   forming barrier material along the bottom and sides of the opening and a top surface of the mold layer; and
   anisotropically etching the barrier material to remove the barrier material from the bottom of the opening and the top surface of the mold layer.

14. The method of claim 13, wherein the forming of the barrier layer comprises forming barrier material on the substrate by a chemical vapor deposition process, an atomic layer deposition process or a molecular beam epitaxy process.

15. The method of claim 14, wherein the barrier material is at least one material selected from the group consisting of silicon oxide, titanium oxide, aluminum oxide, tantalum oxide, silicon nitride, silicon oxynitride, silicon carbonitride, germanium oxide, germanium nitride, germanium oxynitride and germanium carbonitride.

16. The method of claim 12, wherein the forming of the mold layer comprises forming a layer selected from the group consisting of doped or undoped polysilicon, on the substrate.

17. The method of claim 12, wherein the forming of at least one mold layer comprises forming a plurality of mold layers, each comprising silicon but excluding oxides of silicon, on the insulating interlayer and the contact plug, and further comprising forming on each of at least one of the mold layers after it is formed a capacitor support having an etch selectivity with respect to the material of the mold layers, and wherein the opening is formed through the support.

18. A method of manufacturing a capacitor, comprising:
   forming a mold layer comprising doped or undoped polysilicon on an upper surface of a substrate;
   etching the mold layer to form an opening, extending through the mold layer, and which has a bottom and sides that are substantially perpendicular to the upper surface of the substrate;
   forming a barrier layer along the sides of the opening, wherein the barrier layer is of at least one material selected from the group consisting of silicon oxide, titanium oxide, aluminum oxide, tantalum oxide, silicon nitride, silicon oxynitride, silicon carbonitride, germanium oxide, germanium nitride, germanium oxynitride and germanium carbonitride;
   forming a lower electrode of a metal or metal nitride in the opening including over the barrier layer;
   removing the mold layer and the barrier layer; and
   sequentially forming a dielectric layer and an upper electrode on the lower electrode.

19. The method of claim 18, wherein the etching is a dry etch in which the mold layer is exposed to etching gas selected from the group consisting of hydrogen fluoride (HF), hydrogen bromide (HBr), tetrafluoromethane ($CF_4$), hexafluoroethane ($C_2F_6$), trifluoromethane ($CHF_3$), difluoromethane ($CH_2F_2$), methyl bromide ($CH_3Br$), chlorotrifluoromethane ($CClF_3$), trifluorobromomethane ($CBrF_3$), carbon tetrachloride ($CCl_4$), sulfur hexafluorid ($SF_6$), chlorine ($Cl_2$), and nitrogen trifluorude ($NF_3$).

20. The method of claim 18, wherein the etching is a wet etch in which the mold layer is wetted by a solution selected from the group consisting of solutions of hydrogen fluoride (HF), ammonium hydroxide ($NH_4OH$), potassium hydroxide (KOH), and sodium hydroxide (NaOH), and a buffered oxide etch (BOE) solution.

* * * * *